United States Patent
Park et al.

(10) Patent No.: US 7,668,263 B2
(45) Date of Patent: Feb. 23, 2010

(54) MULTI-FREQUENCY SYNTHESIZING APPARATUS AND METHOD FOR MULTI-BAND RF RECEIVER

(75) Inventors: Eun Chul Park, Yongin-si (KR); Hyun Soo Chae, Seoul (KR); Hoon Tae Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/262,234

(22) Filed: Oct. 31, 2008

(65) Prior Publication Data

US 2009/0061811 A1   Mar. 5, 2009

Related U.S. Application Data

(62) Division of application No. 11/481,964, filed on Jul. 7, 2006.

(30) Foreign Application Priority Data

Jan. 24, 2006   (KR) ...................... 10-2006-0007365

(51) Int. Cl.
  *H04L 27/04*   (2006.01)
  *H03D 1/24*    (2006.01)
(52) U.S. Cl. ...................... 375/344; 329/356
(58) Field of Classification Search ................. 375/295, 375/316, 326, 344, 327, 268, 272, 277, 300, 375/301, 296, 270; 455/130, 161, 164.1, 455/165.1; 327/357, 39, 44, 45, 46
See application file for complete search history.

(56) References Cited

U.S. PATENT DOCUMENTS

| | | | |
|---|---|---|---|
| 7,321,268 B2* | 1/2008 | Chang et al. | 331/37 |
| 7,580,486 B2* | 8/2009 | Cha et al. | 375/344 |
| 2005/0282514 A1* | 12/2005 | Kang et al. | 455/313 |
| 2007/0026816 A1* | 2/2007 | Heidari et al. | 455/76 |
| 2007/0139124 A1* | 6/2007 | Stadius | 331/2 |
| 2007/0155350 A1* | 7/2007 | Razavi et al. | 455/147 |

FOREIGN PATENT DOCUMENTS

| | | |
|---|---|---|
| EP | 0-665-651 A2 | 1/1995 |
| EP | 01-199-811 A1 | 10/2000 |
| JP | 2000-244360 A | 9/2000 |
| KR | 20-1989-016626 U | 8/1989 |
| KR | 10-2000-0047695 A | 7/2000 |
| KR | 10-2001-0010375 A | 2/2001 |
| KR | 10-2005-0037083 A | 4/2005 |
| WO | 01/091299 A3 | 11/2001 |

* cited by examiner

*Primary Examiner*—Tesfaldet Bocure
(74) *Attorney, Agent, or Firm*—Sughrue Mion, PLLC

(57) ABSTRACT

A frequency synthesizing apparatus and method for a multi-band radio frequency (RF) receiver is provided. The frequency synthesizing apparatus includes a simple circuit configuration with a single SSB mixer and thus, may synthesize six high frequency signals. Signals to be inputted into the SSB mixer include a first signal and a second signal. The first signal is generated based on a VCO and a PPF. Also, the second signal is selected from a plurality of frequency divided signals which are generated by dividing a signal generated in the VCO via a plurality of dividers.

5 Claims, 5 Drawing Sheets

MULTI-FREQUENCY SYNTHESIZING APPARATUS AND METHOD FOR MULTI-BAND RF RECEIVER

CROSS-REFERENCE TO RELATED APPLICATIONS

This is a divisional of application Ser. No. 11/481,964 filed Jul. 7, 2006. The entire disclosure of the prior application Ser. No. 11/481,964 is considered part of the disclosure of the accompanying divisional application and is hereby incorporated by reference. This application claims priority from Korean Patent Application No. 10-2006-0007365, filed on Jan. 24, 2006, in the Korean Intellectual Property Office, the entire disclosure of which is incorporated herein by reference.

BACKGROUND OF THE INVENTION

1. Field of the Invention

The present invention relates to a frequency synthesizing apparatus for a multi-band radio frequency (RF) receiver, and more particularly, to a multi-frequency synthesizing apparatus and method which can reduce a circuit area and may be low powered.

2. Description of the Related Art

A high speed wireless data transceiving system such as a cellular phone, a digital multimedia broadcasting (DMB) phone, a personal digital assistant (PDA), etc., needs a frequency synthesizer or a frequency mixer processing multi-tones for frequency down conversion in a transceiver. For example, a multi-frequency synthesizer is utilized to receive an RF signal and convert the received RF signal into a baseband signal, in all bands utilizing a Multi-Band Orthogonal Frequency Division Multiplexing (MB-OFDM) scheme for a fourth generation mobile communication system or a ubiquitous system.

FIG. 1 is a diagram illustrating a multi-band of an OFDM scheme according to the related art. As shown in FIG. 1, five band groups #1, #2, #3, #4 and #5 are allowed to be allocated for an MB-OFDM scheme, i.e., between 3.1 and 10.6 GHz. The Federal Communications Commission (FCC) regulates that the band group #1 must be utilized, and other remaining band groups #2 to #5 may be utilized as necessary.

The fourth generation mobile communication system provides integrated services such as a voice, an image, multimedia, access to the Internet, a voice mail, an instance message, etc via one terminal with utilizing a satellite network, a wireless local area network (WLAN) and the Internet. As potential demands of the band group #1 for the fourth generation mobile communication increase, utilization of another band group is currently being discussed. Also, since a lot of interference from a WLAN utilizing an identical frequency band exists in a center frequency of the band group #2, i.e., in a 5544 MHz band, services of the fourth generation mobile communication utilizing a frequency band of the band group #3, #4 or #5 need to be developed.

FIG. 2 is a diagram illustrating a related art frequency synthesizer 200 for generating a multi-frequency signal. A predetermined receiver (Rx) mixer is utilized for an RF receiver to down convert a multi-band RF signal into a baseband. In this instance, a local signal RFO that is output from the frequency synthesizer 200 may be supplied to be synthesized with a received RF signal.

To obtain a multi-band local signal RFO, a single side band (SSB) mixer 230 is utilized. In this instance, the SSB mixer 230 generates a signal whose frequency is an addition of frequencies or a difference of frequencies between two received signals. However, in this case, the single SSB mixer 230 can only generate one of two components which are an addition of frequencies or a difference of frequencies between the two received signals. Accordingly, a plurality of SSB mixers and switches are generally utilized for down converting a large number of multi-band RF signals in a ubiquitous system.

The SSB mixers receive high frequency signals, RF1, RF2, . . . , from a voltage controlled oscillator (VCO)/frequency divider (DIV) 220, which is connected to a phase locked loop (PLL) 210, and synthesize a necessary frequency signal. In this instance, a plurality of PLLs, VCOs or DIVs may be utilized. Also, switches are needed for selecting any one of multi-frequency signals synthesized in the SSB mixers, which is necessary for down converting a received RF signal.

As described above, necessary multi-band signals may be generated by utilizing a large number of SSB mixers, PLLs, VCOs or DIVs. However, in this case, a required circuit area may be unacceptably increased to embody a PLL, a VCO/DIV and SSB mixers, and a huge amount of power may also be consumed. Also, since a large number of harmonics are generated that cause undesired tones, a stable and clean local signal LO may not be obtained.

SUMMARY OF THE INVENTION

The present invention provides a multi-frequency synthesizer which can be very efficient in utilizing a circuit area with a low power consumption so as to be applicable to a multi-band RF receiver, e.g., an MB-OFDM scheme.

The present invention also provides a method of synthesizing multi-frequency signals utilizing frequency dividers and polyphase filters.

According to an aspect of the present invention, there is provided a frequency synthesizer including: a voltage controlled oscillator generating a first high frequency signal which has a certain frequency; a polyphase filter adjusting a phase of the first high frequency signal and generating a Q signal of the first high frequency signal; a plurality of dividers generating a plurality of frequency divided signals based on the first high frequency signal and Q signals of the plurality of frequency divided signals; and a single side band (SSB) mixer generating a frequency synthesized signal whose frequency is a frequency synthesis of the first high frequency signal and a second high frequency signal, from the first high frequency signal and the Q signal of the first high frequency signal, and the second high frequency signal and a Q signal of the second high frequency signal which are selected from the plurality of frequency divided signals and the Q signals of the plurality of frequency divided signals.

The SSB mixer receives three sets of the plurality of frequency divided signals and the Q signals of the plurality of frequency divided signals and generates six frequency synthesized signals. In this instance, the generated six frequency synthesized signals have center frequencies covering band groups #3 and #4 of an MB-OFDM scheme.

According to other aspect of the present invention, there is provided a frequency synthesizer including: a voltage controlled oscillator generating a high frequency signal which has a certain frequency; a first divider one-half dividing a frequency of the high frequency signal and generating the one-half divided signal and a Q signal of the one-half divided signal; a second divider one-third dividing a frequency of the high frequency signal; a third divider one-fifth dividing a frequency of the one-third divided signal; a polyphase filter adjusting a phase of the one-fifth divided signal and generating a Q signal of the one-fifth divided signal; and an SSB mixer generating a frequency synthesized signal whose frequency is a frequency synthesis of the one-half divided signal and the one-fifth divided signal, from the one-half divided signal and the Q signal of the one-half divided signal, and the one-fifth divided signal and the Q signal of the one-fifth divided signal.

According to another aspect of the present invention, there is provided a method of synthesizing frequencies, including: generating a first high frequency signal which has a certain frequency; generating a Q signal of the first high frequency signal by adjusting a phase of the first high frequency signal; generating a plurality of frequency divided signals and Q signals of the plurality of frequency divided signals based on the first high frequency signal; and selecting any one set of the plurality of frequency divided signals and the Q signals of the plurality of frequency divided signals as a second high frequency signal and a Q signal of the second high frequency signal; and generating a frequency synthesized signal whose frequency is a frequency synthesis of the first high frequency signal and the second high frequency signal, from the first high frequency signal and the Q signal of the first high frequency signal and the second high frequency signal and the Q signal of the second high frequency signal.

BRIEF DESCRIPTION OF THE DRAWINGS

The above and other aspects of the present invention will become apparent and more readily appreciated from the following detailed description of exemplary embodiments, taken in conjunction with the accompanying drawings of which.

DETAILED DESCRIPTION OF THE EXEMPLARY EMBODIMENTS

Figure 1:
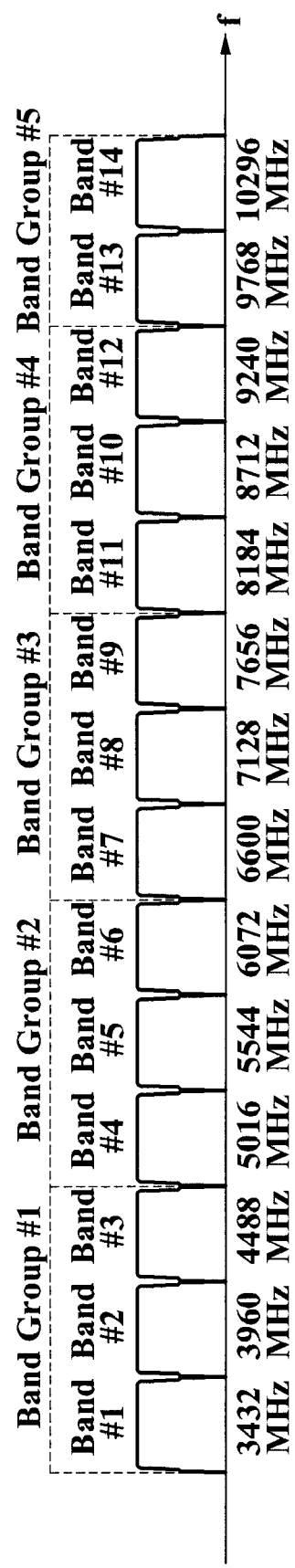
FIG. 1 illustrates a multi-band of an OFDM scheme according to the related art.
Figure 2:
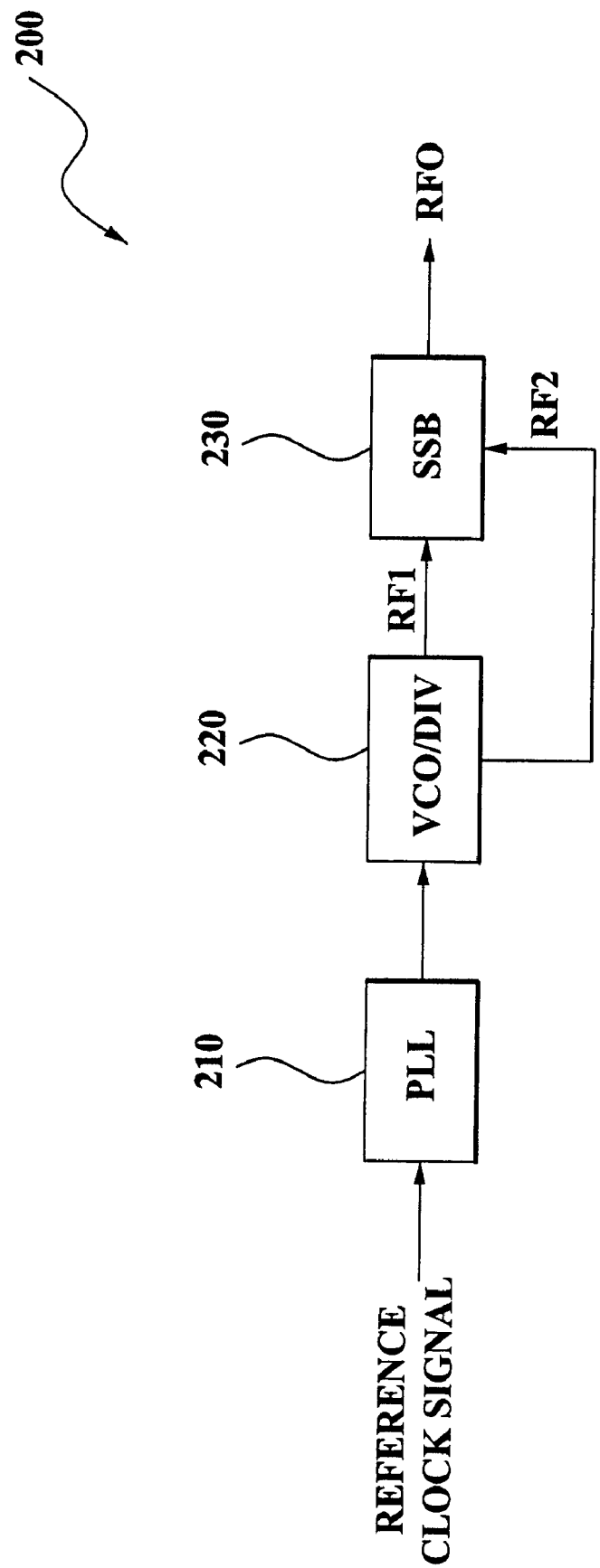
FIG. 2 illustrates a related art frequency synthesizer for generating a multi-frequency signal.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 3:
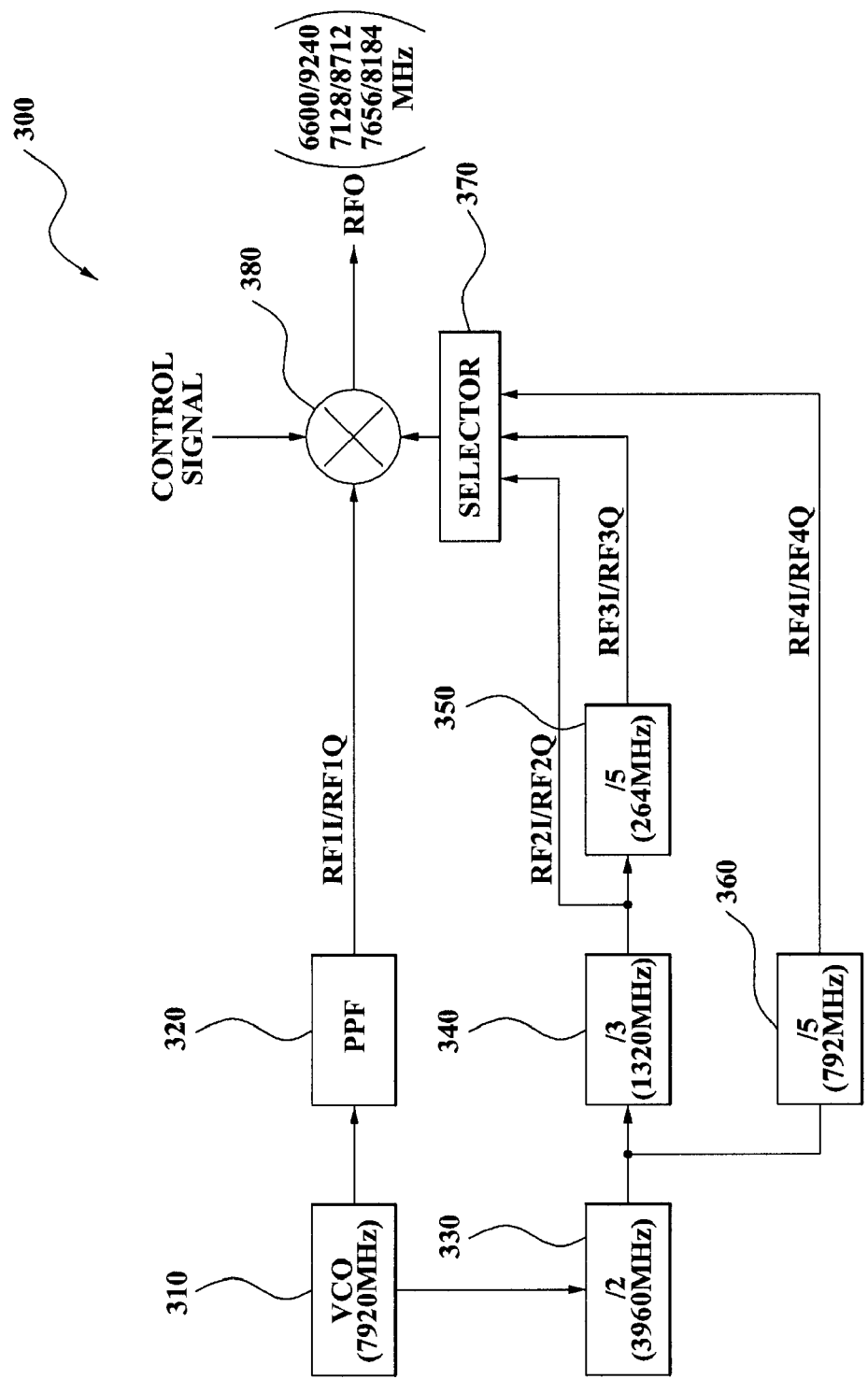
FIG. 3 illustrates a multi-frequency synthesizer according to an exemplary embodiment of the present invention.

FIG. 3 illustrates a multi-frequency synthesizer 300 according to an exemplary embodiment of the present invention. Referring to FIG. 3, the multi-frequency synthesizer 300 includes a voltage controlled oscillator (VCO) 310, a polyphase filter (PPF) 320, a first divider 330, a second divider 340, a third divider 350, a fourth divider 360, a selector 370 and an SSB mixer 380.

The multi-frequency synthesizer 300 generates a frequency synthesized signal RFO having various center frequencies so as to be applicable to a multi-band RF receiver, e.g., a receiver utilizing an MB-OFDM scheme. As an example, the multi-frequency synthesizer 300 generates high frequency signals which have center frequencies corresponding to band groups #3 and #4 of an MB-OFDM scheme shown in FIG. 1. The frequency synthesized signal RFO may be utilized to down convert an RF signal of a corresponding band into a baseband signal, when a multi-band RF signal is received in a fourth generation mobile communication system or a ubiquitous system.

Namely, the multi-frequency synthesizer 300 may generate six high frequency signals corresponding to the band groups #3 and #4 of the MB-OFDM scheme with a small circuit area and a low power consumption, by utilizing the VCO 310, the PPF 320, the plurality of dividers 330 to 360, and the single SSB mixer 380.

The VCO 310 generates a high frequency signal RF1I with a certain frequency, e.g., 7920 MHz. Also, the VCO 310 may be a part of a PLL (not shown) which operates according to a reference clock signal.

The PPF 320 adjusts a phase of the high frequency signal RF1I which is an output of the VCO 310 and generates a Q signal RF1Q of the high frequency RF1I. The high frequency signal RF1I and the Q signal RF1Q of the high frequency signal RF1I are input into the SSB mixer. In this instance, a Q signal is a quadrature-phase signal, i.e., a signal having a 90 degree phase difference from an in-phase (I) signal.

The first divider 330 divides a frequency of the output RF1I of the VCO 310 by two. Namely, the first divider 330 generates a signal with a frequency of 3960 MHz, which is one half of the frequency of the output RF1I, i.e., 7920 MHz in this example, of the VCO 310.

The second divider 340 divides the frequency, 3960 MHz in this example, of the divided signal output by the first divider 330 by three, and thus, generates a signal RF2I with a frequency of 1320 MHz in this example. Also, the second divider 340 generates a Q signal RF2Q of the divided signal RF2I. In this instance, a PPF (not shown) may be utilized to generate the Q signal RF2Q of the divided signal RF2I from the divided signal RF2I.

The third divider 350 divides the frequency, 1320 MHz in this example, of the divided signal RF2I output by the second divider 340 by five and thus, generates a signal RF3I with a frequency of 264 MHz in this example. Also, the third divider 350 generates a Q signal RF3Q of the divided signal RF3I, from the divided signal RF3I, utilizing a PPF (not shown).

The fourth divider 360 divides the frequency, 3960 MHz in this example, of the divided signal output by the first divider 330 by five, and thus, generates a signal RF4I with a frequency of 792 MHz in this example. Also, the fourth divider 360 generates a Q signal RF4Q of the divided signal RF4I, from the divided signal RF4I, utilizing a PPF (not shown).

Each of the four frequency signals RF1 to RF4 may be a set of differential signals, each set of differential signals including two signals having a 180 degree phase difference from each other. When differential signals are utilized, a signal-to-noise ratio (SNR) may be improved and a high frequency signal may be easily processed. Namely, each of RF1I, RF1Q, RF2I, RF2Q, RF3I, RF3Q, RF4I and RF4Q may be a set of two signals having a 180 degree phase difference from each other.

The selector 370 selects any one set of output sets of the second divider 340 through the fourth divider 360 and inputs the selected set into the SSB mixer 380.

The SSB mixer 380 generates a frequency synthesized signal whose frequency is a frequency synthesis of two signals, from the high frequency signal RF1I and the Q signal RF1Q of the high frequency signal RF1I and one of the high frequency signals, e.g., RF2I, selected from the selector 370 and the Q signal, e.g., RF2Q, of the selected high frequency signal, i.e., RF2I in this example. In this instance, the frequency synthesized signal in the SSB mixer 380 is an SSB signal whose frequency is an addition of frequencies or a difference of frequencies between the two signals.

Figure 4:
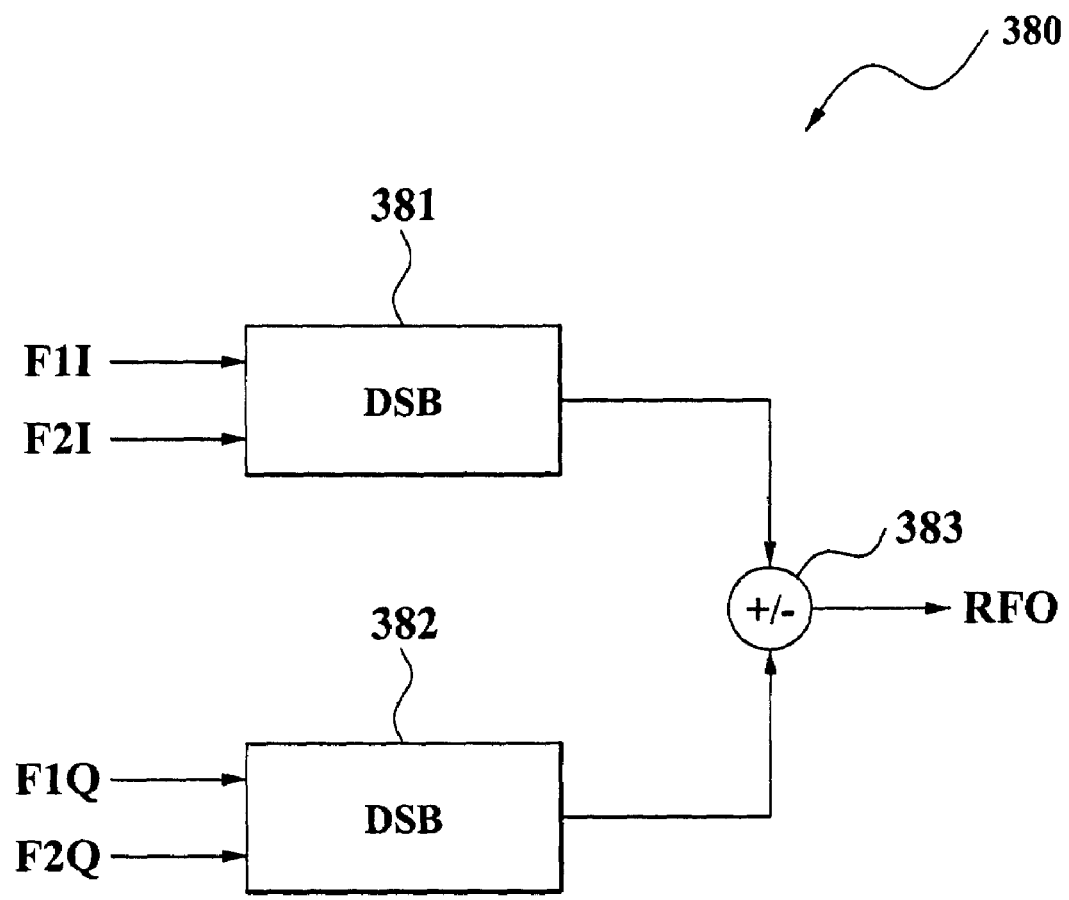
FIG. 4 illustrates an SSB mixer of FIG. 3.

The SSB mixer 380 of FIG. 3 has a structure shown as in FIG. 4. As an example, the SSB mixer 380 includes a first double side band (DSB) mixer 381, a second DSB mixer 382 and an adder/subtractor 383. The first DSB mixer 381 generates a DSB signal simultaneously mixed with one component, which is an addition of frequencies of two received signals F1I and F2I, and another component, which is a difference of frequencies of two received signals F1I and F2I. Also, the second DSB mixer 382 generates a DSB signal simultaneously mixed with one component, which is an addition of frequencies of two received signals F1Q and F2Q, and another component, which is a difference of frequencies of two received signals F1Q and F2Q. Accordingly, when an output of the first DSB mixer 381 and an output of the second DSB mixer 382 is added or subtracted in the adder/subtractor 383, a frequency synthesized signal, RFO, whose frequency is an addition of frequencies or a difference of frequencies between the two pairs of received signals F1I and F2I, may be obtained. In this instance, addition/subtraction in the adder/subtractor 383 may be performed by a method of connecting circuit outputs which is in respective differential amplifiers constituting the first DSB mixer 381 and the second DSB mixer 382. Also, the frequency synthesized signal, RFO, whose frequency is an addition of frequencies of or a difference of frequencies between the two received signals F1I and F2I, may be obtained by switching a phase of differential signals constituting F2I among inputs of the first DSB mixer 381 or by switching a phase of differential signals constituting F2Q among inputs of the second DSB mixer 382.

Namely, an frequency addition or a subtraction may be performed by controlling a phase of differential signals constituting a high frequency signal or a Q signal of the high frequency signal, e.g., RF2I or RF2Q, according to a control signal. As described above, six frequency synthesized signals corresponding to the band groups #3 and #4 of an MB-OFDM scheme may be generated according to an operation of the SSB mixer 380. As an example, when the selector 370 selects signals with a frequency of 1320 MHz, i.e., RF2I and RF2Q in this example, which are also a differential signal set, the SSB mixer 380 generates a signal with a frequency of 9240 MHz or 6600 MHz in this example. Also, when the selector 370 selects signals with a frequency of 264 MHz in this example, i.e., RF3I and RF3Q, which are also a differential signal set, the SSB mixer 380 generates a signal with a frequency of 8184 MHz or 7656 MHz in this example. Also, when the selector 370 selects signals with a frequency of 792 MHz in this example, i.e., RF4I and RF4Q, which are also a differential signal set, the SSB mixer 380 generates a signal with a frequency of 8712 MHz or 7128 MHz in this example.

As described above, the frequency synthesizer 300 of FIG. 3 according to an exemplary embodiment of the present invention may synthesize six high frequency signals by utilizing a simple circuit configuration including the single SSB mixer 380. Two signals to be input into the SSB mixer 380 include a signal which is generated utilizing the VCO 310 and the PPF 320 and a signal which is selected from frequency divided signals utilizing the plurality of dividers 330 to 360.

As described above, six frequency synthesized signals in the multi-frequency synthesizer 300 according to an operation of the SSB mixer 380 may be utilized as a local oscillation signal RFO in a predetermined Rx mixer of a multi-band RF receiver utilizing band groups #3 and #4 of an MB-OFDM scheme. Accordingly, six received RF signals may be directly down converted to a baseband signal.

Figure 5:
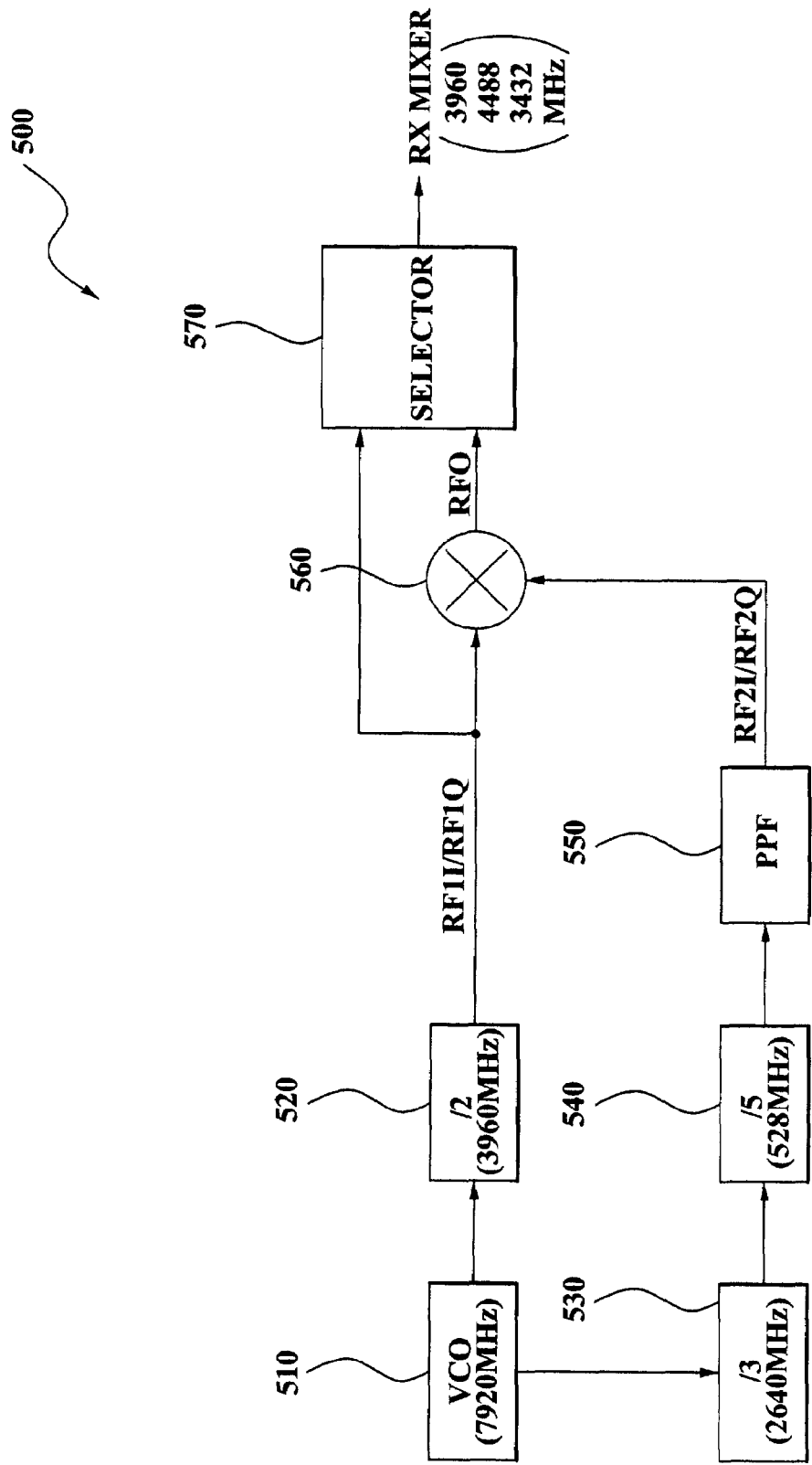
FIG. 5 illustrates a multi-frequency synthesizer according to another exemplary embodiment of the present invention.

FIG. 5 illustrates a multi-frequency synthesizer 500 according to another exemplary embodiment of the present invention. Referring to FIG. 5, the multi-frequency synthesizer 500 includes a VCO 510, a first divider 520, a second divider 530, a third divider 540, a PPF 550, an SSB mixer 560 and a selector 570.

As an example, the multi-frequency synthesizer 500 generates three synthesized signals which have three center frequencies, e.g., 4488 MHz, 3960 MHz, and 3432 MHz, covering a band group #1 of an MB-OFDM scheme. In this instance, the multi-frequency synthesizer 500 may generate three high frequency signals corresponding to bands #1 through #3 of the band group #1 of the MB-OFDM scheme with a small circuit area and a low power consumption, by utilizing the VCO 510, the PPF 550, the plurality of dividers 520 through 540 and the single SSB mixer 560.

The VCO 510 generates a high frequency signal with a certain frequency, e.g., 7920 MHz. The first divider 520 divides the frequency, i.e., 7920 MHz in this example, of the high frequency signal output by the VCO 510 by two and generates a signal RF1I with a frequency of 3960 MHz in this example. Also, the first divider 520 generates a Q signal, RF1Q, of the divided signal RF1I.

The second divider 530 divides the frequency, i.e., 7920 MHz in this example, of the high frequency signal output by the VCO 510 by three and generates a signal with a frequency of 2640 MHz in this example. The third divider 540 divides the frequency, i.e., 2640 MHz in this example, of the divided signal output by the second divider 530 by five and generates a signal RF2I with a frequency of 528 MHz in this example. The PPF 550 adjusts a phase of the divided signal RF2I and generates a Q signal RF2Q of the divided signal RF2I.

Accordingly, the SSB mixer 560 generates a frequency synthesized signal RFO whose frequency is a frequency synthesis of two signals, from the divided signal RF1I with a frequency of 3960 MHz in this example and the Q signal RF1Q of the divided signal RF1I, and the divided signal RF2I with a frequency of 528 MHz in this example and the Q signal RF2Q of the divided signal RF2I. Namely, the SSB mixer 560 generates an SSB signal RFO with a frequency of 4488 MHz or 3432 MHz in this example.

The selector 570 selects one of the output RFO of the SSB mixer 560 and the divided signal RF1I, frequency synthesized signals which have three center frequencies, e.g., 4488 MHz, 3960 MHz and 3432 MHz, covering the band group #1 of the MB-OFDM scheme to be supplied to an RF mixer of a multi-band RF receiver.

As described above, a frequency synthesizer according to the present invention has a comparatively smaller circuit area, and may generate and output multi-frequency signals with a less harmonics than in the related art. Accordingly, the frequency synthesizer may supply multi-frequency local signals, which are necessary for a multi-band RF receiver, by using a small circuit area and also may operate at a high speed with a low power consumption. Accordingly, the frequency synthesizer may be applied to a transceiver of a cellular phone, a DMB phone, a PDA and a ubiquitous system of an MB-OFDM scheme, and may improve a system performance.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves, such as data transmission through the Internet. The computer readable recording medium can also be distributed over network coupled computer systems so that the computer readable code is stored and executed in a distributed fashion.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A frequency synthesizer comprising:
   a voltage controlled oscillator which generates a signal;
   a first divider which divides a frequency of the signal generated by the voltage controlled oscillator by two to generate a first divided signal and a Q signal of the first divided signal;
   a second divider which divides a frequency of the signal generated by the voltage controlled oscillator by three to generate a second divided signal;
   a third divider which divides a frequency of the second divided signal by five to generate a third divided signal;
   a polyphase filter which adjusts a phase of the third divided signal to generate a quadrature (Q) signal of the third divided signal; and
   a single side band (SSB) mixer which generates a frequency synthesized signal having a frequency which is a frequency synthesis of the first divided signal and the third divided signal, from the first divided signal and the Q signal of the first divided signal, and the third divided signal and the Q signal of the third divided signal.

2. The frequency synthesizer of claim 1, further comprising:
   a selector which selects one of the first divided signal and the frequency synthesized signal generated by the SSB mixer.

3. The frequency synthesizer of claim 2, wherein the selector generates three frequency synthesized signals which have center frequencies covering a band group #1 of a Multi-band Orthogonal Frequency Division Multiplexing scheme.

4. A method of synthesizing frequencies, the method comprising:
   generating, by a signal generator, an initial signal;
   dividing, by a first divider, a frequency of the initial signal by two to generate a first divided signal and a Q signal of the first divided signal;
   dividing, by a second divider, a frequency of the initial signal by three to generate a second divided signal;
   dividing, by a third divider, a frequency of the second divided signal by five to generate a third divided signal;
   adjusting, by a polyphase filter, a phase of the third divided signal to generate a quadrature (Q) signal of the third divided signal; and
   generating, by a single side band mixer, a frequency synthesized signal having a frequency which is a frequency synthesis of the first divided signal and the third divided signal, from the first divided signal and the Q signal of the first divided signal, and the third divided signal and the Q signal of the third divided signal.

5. The method of claim 4, further comprising selecting and outputting one of the first divided signal and the frequency synthesized signal.

* * * * *